US012483271B2

United States Patent
Henry et al.

(10) Patent No.: US 12,483,271 B2
(45) Date of Patent: Nov. 25, 2025

(54) METHOD AND ELECTRONIC DEVICE FOR DECODING A DATA STREAM, AND ASSOCIATED COMPUTER PROGRAM AND DATA STREAMS

(71) Applicant: ORANGE, Issy-les-Moulineaux (FR)

(72) Inventors: Félix Henry, Saint-Grégoire (FR); Gordon Clare, Pacé (FR)

(73) Assignee: ORANGE, Issy-les-Moulineaux (FR)

( * ) Notice: Subject to any disclaimer, the term of this patent is extended or adjusted under 35 U.S.C. 154(b) by 147 days.

(21) Appl. No.: 18/029,545

(22) PCT Filed: Sep. 28, 2021

(86) PCT No.: PCT/EP2021/076582
§ 371 (c)(1),
(2) Date: Mar. 30, 2023

(87) PCT Pub. No.: WO2022/069437
PCT Pub. Date: Apr. 7, 2022

(65) Prior Publication Data
US 2023/0370087 A1  Nov. 16, 2023

(30) Foreign Application Priority Data

Sep. 30, 2020 (FR) ........................ 2009994

(51) Int. Cl.
*H03M 7/00* (2006.01)
*H03M 7/30* (2006.01)
(52) U.S. Cl.
CPC ....... *H03M 7/6005* (2013.01); *H03M 7/3066* (2013.01); *H03M 7/3079* (2013.01)
(58) Field of Classification Search
CPC ...... H03M 1/50; H03M 1/1009; H03M 1/201; H03M 1/662; H03M 3/368; H03M 1/164;
(Continued)

(56) References Cited

U.S. PATENT DOCUMENTS 5,548,684 A * 8/1996 Wang ............... H03M 13/41
706/34
6,578,172 B1 * 6/2003 Hamalainen ...... H03M 13/3746
714/787
(Continued)

FOREIGN PATENT DOCUMENTS

EP  3 343 781       7/2018
JP  2014-518473 A   7/2014
(Continued)

OTHER PUBLICATIONS

Liu et al., "Neural Video Coding: A Learning Exploration From Pixel Prediction to Feature Sensing," MPEG Meeting; Jun. 29, 2020-Jul. 3, 2020; Online; (Motion Picture Expert Group or ISOIIEC JTC1/SC29/WG1 1), server date Jun. 24, 2020; downloaded by EPO on Aug. 1, 2020, 2020, pp. 1-17.

(Continued)

*Primary Examiner* — Jean B Jeanglaude
(74) *Attorney, Agent, or Firm* — David D. Brush; Westman, Champlin & Koehler, P.A.

(57) ABSTRACT

A method for decoding a data stream, including a plurality of identifiers and a bit sequence, into a sequence of data of respective predetermined types includes the following operations for obtaining each item of data of the sequence: determining a context on the basis of an identifier, from among the plurality of identifiers, with the type of the relevant item of data; and decoding one portion of the bit sequence by an entropic decoder which receives the bit sequence as an input and is parameterized in the determined context. An electronic decoding device and an associated computer program are also provided.

18 Claims, 4 Drawing Sheets

(58) Field of Classification Search
CPC .... H03M 3/414; H03M 3/458; H03M 1/0854; H03M 1/12
See application file for complete search history.

(56) References Cited

U.S. PATENT DOCUMENTS

| | | | | |
|---|---|---|---|---|
| 2004/0059992 | A1* | 3/2004 | Tan | H03M 13/6325 714/795 |
| 2012/0082218 | A1 | 4/2012 | Misra et al. | |
| 2012/0189049 | A1* | 7/2012 | Coban | H04N 19/96 375/E7.125 |
| 2013/0300591 | A1* | 11/2013 | Marpe | H03M 7/4037 341/67 |
| 2014/0140400 | A1 | 5/2014 | George et al. | |
| 2019/0052883 | A1 | 2/2019 | Ikeda | |
| 2020/0304147 | A1 | 9/2020 | Choi et al. | |

FOREIGN PATENT DOCUMENTS

| | | |
|---|---|---|
| JP | 2014-158303 A | 8/2014 |
| JP | 2019-033456 A | 2/2019 |
| WO | 2022/013247 | 1/2022 |
| WO | 2022/013249 | 1/2022 |

OTHER PUBLICATIONS

International Search Report dated Jan. 12, 2022, for PCT/EP2021/076582, 11 pp.
Written Opinion of the ISA dated Jan. 12, 2022, for PCT/EP2021/076582, 5 pp.
Haojie Liu et al., "[DNNVC] End-to-End Neaural Video Coding—From Pixel Prediction to Feature Sensing", No. m54341, Jun. 24, 2020 (Jun. 24, 2020), 131. MPEG Meeting; Jun. 29, 2020-Jul. 3, 2020; Online; (Motion Picture Expert Group or ISO/IEC JTC1/SC29/WG11), Retrieved from the Internet: http://phenix.int-evry.fr/mpeg/doc_end_user.documentary/131_OnLine/wg11/m54341-yl-m54341_NeauralVideoCoding.zipNeauralVideoCoding-draft-paper.pdf. [retrieved on Jun. 24, 2020] XP030288662, pp. 3, 4 [Submission Pending].
Guo Lu et al., "DVC: An End-to-end Deep Video Compression Framework", the Computer Vision Foundation, 10 pages.
Detlev Marpe et al., "Context-Based Adaptive Binary Arithmetic Coding in the H.264/AVC Video Cpmpression Standard", IEEE Transactions on Circuits and Systems for Video Technoogy, vol. 13, No. 7, Jul. 2003, 17 Pages.
Gary J. Sullivan et al., "Overview of the High Efficiency Video Coding (HEVC) Standard", IEEE Transactions on Circuits and Systems for Video Technology, vol. 22, No. 12, Dec. 2012, 20 Pages.
"ITU-T, H.265, Series H: Audiovisual and Multimedia Systems Infrastructure of audiovisual services—Coding of moving video", Geneva, Nov. 2019, 712 pages.
Simon Wiedemann et al., "Compact and Computationally Efficient Representation of Deep Neural Networks", IEEE Transactions on Neural Networks and Learning Systems, vol. 31, No. 3, Mar. 2020, 14 pages.
Simon Wiedemann et al., "DeepCABAC: Context-adaptive binary arithmetic coding for deep neural network compression", 4 pages.
English translation of the Written Opinion of the International Searching Authority dated Jan. 12, 2022 for corresponding International Application No. PCT/EP2021/076582, filed Sep. 28, 2021.
Japanese Notice of Reasons for Rejection dated Aug. 26, 2025 for corresponding Japanese Application No. 2023-519767.
Hujun Yin et al., 2200 Mission College Blvd, Santa Clara, CA, 95054, USA, "CE13-1.2: Adaptive convolutional neural network loop filter," JVET-N JVET-N0480-V2 (Mar. 19, 2019), Mar. 19, 2019, P1, P2.

* cited by examiner

METHOD AND ELECTRONIC DEVICE FOR DECODING A DATA STREAM, AND ASSOCIATED COMPUTER PROGRAM AND DATA STREAMS

This application is the U.S. national phase of International Application No. PCT/EP2021/076582 filed Sep. 28, 2021 which designated the U.S. and claims priority to FR FR2009994 filed Sep. 30, 2020, the entire contents of each of which are hereby incorporated by reference.

TECHNICAL FIELD OF THE INVENTION

The present invention relates to the technical field of data decoding.

In particular, it relates to a method and an electronic device for decoding a data stream, as well as associated computer program and data stream.

STATE OF THE ART

Entropy encoding is used, in particular in the field of audio or video content encoding, to optimally compress data taking into account the statistics of appearance of the different symbols in these data.

Within this framework, mention can be made for example of CABAC ("Context-based adaptive binary arithmetic coding") as described in the article "*Context-based adaptive binary arithmetic coding in the H.264/AVC video compression standard*", by D. Marpe, H. Schwarz, and T. Wiegand, in IEEE Transactions on Circuits and Systems for Video Technology, vol. 13, no. 7, pp. 620-636, July 2003.

When used for entropy encoding or entropy decoding of data within the framework of a standard (for example, a standard defining a manner to compress an audio or video content), the entropy decoder is, at all times, parameterized in a context that depends, in a manner predefined in the relevant standard, on the previously encoded or decoded syntax elements.

DISCLOSURE OF THE INVENTION

The present invention proposes a method for decoding a data stream comprising a plurality of identifiers and a sequence of binary elements, into a sequence of data of respective predetermined types, the method comprising the following steps for obtaining each piece of data of said sequence:
  determining a context on the basis of an identifier, from among the plurality of identifiers, that is associated with the type of the relevant piece of data;
  decoding part of the sequence of binary elements by means of an entropy decoder that receives the sequence of binary elements as an input and that is parameterized in the determined context.

The presence, in the data stream, of identifiers indicating the context to be used for decoding the different types of data provides greater flexibility in the use of entropy encoding, which is interesting in particular when the format of the data is not totally predefined.

The data obtained are for example values representative of an audio or video content. These representative values may be produced, during an encoding process, by an encoding artificial neural network, as described hereinafter (or, more generally, by a machine learning method such as a deep learning method or a random forest learning method).

The data stream may also comprise a piece of information indicative of a set of contexts usable within the entropy decoder. Such piece of information is for example indicative of a number of contexts usable within the entropy decoder.

The data stream may moreover comprise, for each context usable within the entropy decoder, a piece of data for parameterizing the relevant context.

The decoding method may then comprise a step of initializing each context usable within the entropy decoder using the piece of data for parameterizing the relevant context.

The above-mentioned indicative piece of information and the parameterization data thus make it possible to configure the entropy decoder before effective implementation of the entropy decoding.

The decoding method may moreover comprise a step of applying the obtained data to the input of an artificial neural network.

Such an artificial neural network is for example implemented by a processing unit (possibly a parallel processing unit). The method may then comprise a step of configuring the processing unit as a function of data included in the data stream.

The invention is particularly interesting in this context in which the technical nature of each of the different pieces of data (or representative values) that are handled depends on the artificial neural network that is used (which is itself defined by data as just mentioned) and is thus not predetermined, so that the context used for entropy encoding of a particular piece of data cannot be defined in advance (as already indicated, such a previous definition may for example be given in a standard).

As already indicated, the invention is however not limited to this context and is of interest if the respective association of the data to be encoded and the entropy encoding contexts cannot be defined in advance. Therefore, the invention can advantageously be used for the entropy encoding of texts written in several languages using different alphabets. The number of signs of the alphabet and the probability of appearance thereof being different in each language, the invention makes it possible, in such a situation, to specify the context to be used for the entropy encoding of the signs or words specific to a language.

Generally, the decoding method can moreover comprise a machine learning method, such as a deep learning method or a random forest learning method. The data stream may then include data for configuration of this machine learning method and/or a step may be provided for configuring a processing unit by means of these configuration data in such a way as to implement this machine learning method.

Generally, the invention can be used to encode data coming from a neural network or to decode data to be provided to a neural network. A neural network is to be understood as a processing process including a large number of similar steps, wherein only the parameters of these steps are different from each other, and set by a learning process, the steps being adapted to be implemented in a massively parallel manner. Therefore, "neural network" can refer to a series of layers performing a linear filtering of the data coming from the input layer or from the preceding layer, each filtering being followed by the application of a non-linear function (neural network in the conventional sense). As an alternative, a neural network may refer to a series of tests, the result of each test determining the following tests to be applied (random forest), or also other processing processes having the above-mentioned characteristic.

According to an embodiment described hereinafter, the above-mentioned sequence of data forms a set of feature maps.

In this case, according to a first possibility, the identifiers of the plurality of identifiers are respectively associated with the feature maps of the set of feature maps. In this case, it may be provided that the context determined for obtaining an element of a given feature map is determined on the basis of the identifier associated with the given feature map.

According to a second possibility, when the feature maps of the set of feature maps have a common structure within which each element of a feature map is defined by a position, the identifiers of the plurality of identifiers can be respectively associated with different positions in the common structure. It may then be provided that the context determined for obtaining a given element of a feature map is determined on the basis of the identifier associated with the position defining this given element.

The invention also proposes an electronic device for decoding a data stream comprising a plurality of identifiers and a sequence of binary elements into a sequence of data of respective predetermined types, the electronic device comprising an entropy decoder receiving the sequence of binary elements as an input, and a configuration module designed to determine a context on the basis of an identifier, from among the plurality of identifiers, that is associated with the type of the piece of data to be obtained, and to parameterize the entropy decoder in the determined context so as to obtain said data at the output of the entropy decoder.

The invention moreover proposes a computer program comprising instructions executable by a processor and designed to implement a decoding method as proposed hereinabove when these instructions are executed by the processor.

The invention finally proposes a data stream representing a sequence of data of respective predetermined types, and comprising a plurality of identifiers and a sequence of binary elements, each identifier being representative of a context in which an entropy decoder is parameterized to obtain, when this entropy decoder receives as an input part of the sequence of binary elements, at least one piece of data having a type associated with this identifier.

Of course, the different features, alternatives and embodiments of the invention can be associated with each other according to various combinations, insofar as they are not mutually incompatible or exclusive.

DETAILED DESCRIPTION OF THE INVENTION

Figure 1:
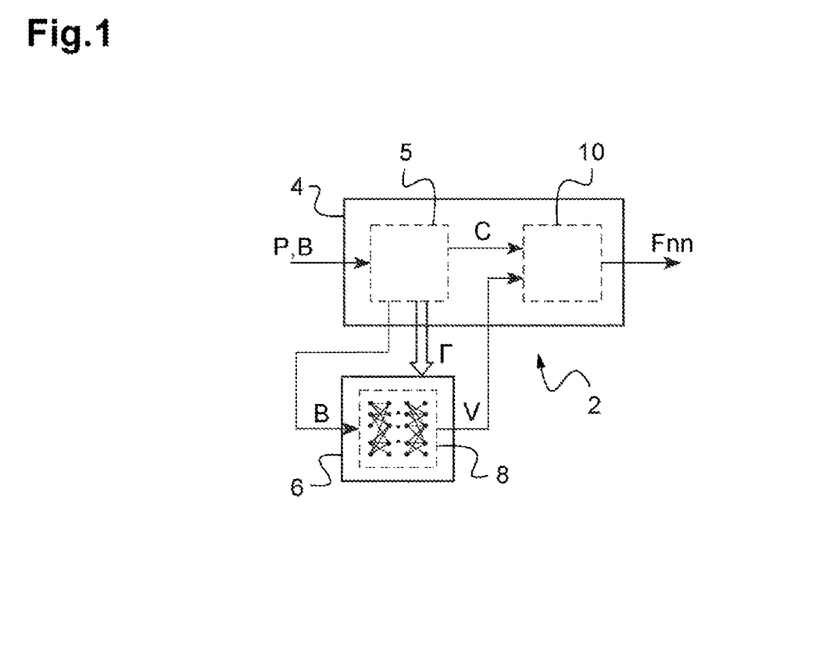
FIG. 1 shows an electronic encoding device used within the framework of the invention.

Moreover, various other features of the invention will be apparent from the appended description made with reference to the drawings that illustrate non-limiting embodiments of the invention, and wherein:

FIG. 1 shows an electronic encoding device 2 including an entropy encoder 10.

This electronic encoding device 2 comprises a processor 4 (for example, a microprocessor) and a parallel processing unit 6, for example a Graphical Processing Unit or GPU, or a Tensor Processing Unit or TPU.

Processor 4 is programmed (for example by means of computer program instructions executable by processor 4 and stored in a memory—not shown—associated with processor 4) to implement a control module 5 and the already mentioned entropy encoder 10.

As schematically shown in FIG. 1, control module 5 receives data P, B representing an audio or video content to be compressed, here format data P and content data B.

Format data P indicate characteristics of the format of representation of the audio or video content, for example, for a video content, the image sizes (in pixels), the frame rate, the binary depth of the luminance information and the binary depth of the chrominance information.

Content data B form a representation (here not compressed) of the audio or video content. For example, in the case of a video content, the content data comprise, for each pixel of each image of a sequence of images, data representing a luminance value of the pixel and data representing chrominance values of the pixel.

Parallel processing unit 6 is designed to implement an artificial neural network 8 after having been configured by processor 4 (for example, by control module 5). For that purpose, parallel processing unit 6 is designed to perform in parallel, at a given time, a plurality of operations of the same type.

As explained hereinafter, artificial neural network 8 is used within the framework of a processing of content data B aiming at obtaining values V representative of the audio or video content.

As an alternative, another type of machine learning method than an artificial neural network could be used, for example another type of deep learning method or a random forest learning method.

In the embodiment described here, when content data B are applied to the input of artificial neural network 8, artificial neural network 8 produces representative values V as an output.

Content data B applied to the input of artificial neural network 8 (i.e. applied to an input layer of artificial neural network 8) may represent a block of an image, or a block of an image component (for example, a block of a luminance or chrominance component of this image, or a block of a color component of this image), or an image of a video sequence, or a component of an image of a video sequence (for example, a luminance or chrominance component, or a color component), or also a series of images of the video sequence.

It may be provided for example in this case that some at least of the neurons (or nodes) of the input layer each receive a pixel value of an image component, said value being represented by one of the content data B.

As an alternative, the processing of content data B may include the use of several artificial neural networks, as described for example in the above-mentioned article "*DVC: An End-to-end Deep Video Compression Framework*", by Guo Lu et al., 2019 IEEE/CVF Conference on Computer Vision and Pattern Recognition (CVPR), June 2019.

Figure 2:
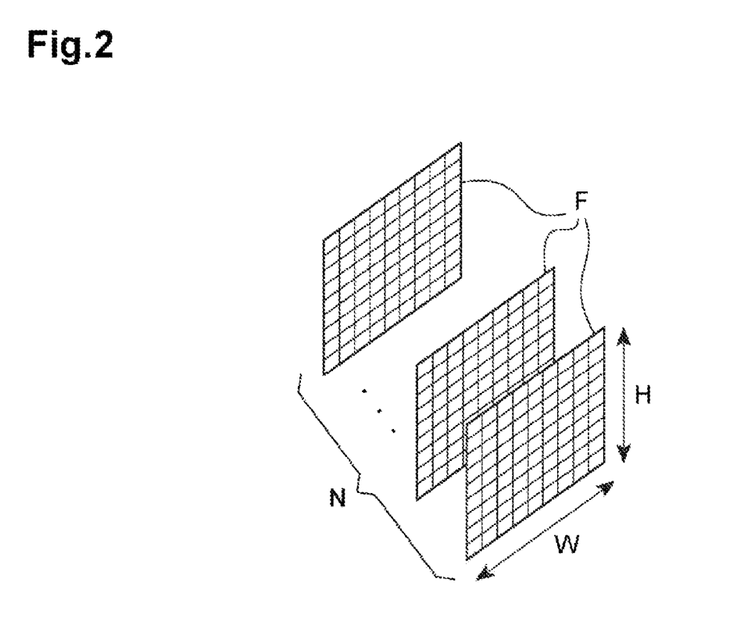
FIG. 2 schematically illustrates feature maps used by the electronic encoding device of FIG. 1.

Representative values V produced at the output of artificial neural network 8 are here organized into a sequence of feature maps F, as schematically shown in FIG. 2. Artificial neural network 8 here produces for example N feature maps F.

Each feature map F has for example a two-dimensional structure (or matrix structure). Thus, each feature map F here forms a matrix of H rows and W columns.

An element located at a given position in a given feature map F corresponds to representative value V produced by an output node (or node of the output layer) of the artificial neural network, this output node being associated in a predefined manner with this given position and with this given feature map F. According to a possible embodiment, artificial neural network 8 produces as an output (i.e. on its output layer), at a given time, all the N feature maps. According to another possible embodiment, different sets of content data B (corresponding for example to different positions in the image) are applied at different times to the input (i.e. to the input layer) of artificial neural network 8, and artificial neural network 8 produces at each of these different times, as an output (i.e. on its output layer), a corresponding feature map F (the output nodes of artificial neural network 8 being in this case respectively associated with the different positions of a single feature map F).

As an alternative, representative values V produced at the output of artificial neural network 8 may be organized into an ordered sequence of representative values V. When content data B applied to the input of artificial neural network 8 represent a block of an image (or a block of an image component), the ordered sequence of representative values V produced at the output of artificial neural network 8 is associated with this block. The different sequences of representative values successively produced by artificial neural network 8 are thus respectively associated with the different blocks of the image (or with the different blocks of the relevant component of the image).

According to still another alternative, representative values V produced at the output of artificial neural network 8 are placed within a multi-dimensional (for example, M-dimensional) structure of data. Each element of this structure is then identified by its position within the structure, i.e. in the above-mentioned example, by means of an M-tuplet of coordinates. A representative value V produced by a given output node (i.e. by a given node of the output layer) of artificial neural network 8 then forms an element of the structure identified by a position within the structure associated in a predefined manner with this output node (i.e. by coordinates associated in a predefined manner with this output node).

Representative values V produced at the output of artificial neural network 8 are applied to the input of entropy encoder 10.

These representative values V are for example applied in a predefined order. Therefore, when representative values V are organized into a sequence (ordered) of feature maps F, the different feature maps F are applied one after the other (in the above-mentioned sequence order), and the different elements of a same feature map F (which each correspond to a representative value) are applied according to a predefined scheme (according to their position) within the feature map F.

Entropic encoder 10 is designed to encode several statistical sources each corresponding to a particular probability of appearance of the symbols to be encoded. For that purpose, entropy encoder 10 may be parameterized in a particular context, associated with a given statistical source and in which entropy encoder 10 produces an optimum entropy encoding if the effectively encoded symbols (here representative values V) meet the expected probability for this statistical source.

Entropy encoder 10 is here of the CABAC ("Context-based adaptive binary arithmetic coding") type. As an alternative, it could be another type of entropy encoder, for example an encoder of the Huffman type, an arithmetic encoder or an LZW ("Lempel-Ziv-Welch") encoder.

As explained hereinafter, entropy encoder 10 is, at all times, parameterized by control module 5 in a context C that depends on the type of representative value V to be encoded at that time (representative value V coming from artificial neural network 8).

In the case described here, where representative values V are organized into a sequence of feature maps F, the context C selected by control module 5 to parameterize entropy encoder 10 for entropy encoding of an element of a feature map F may for example depend (in a predefined manner) on the relevant feature map F and/or on the position of the element in the feature map F. (The association of a certain context with a feature map and/or with a position in the feature map is made for example using previous statistical measurements, for a great number of images processed by means of encoding artificial neural network 8, of the probability of appearance of the symbols in this feature map or at this position. Such an association has for object to isolate the different statistical sources in representative values V in order to encode each of these statistical sources with a specific context, and therefore maximize the compression.)

Entropy encoder 10 produces as an output a sequence of binary elements (or sequence of bits) Fnn.

An example of encoding method implemented by electronic encoding device 2 will now be described with reference to FIG. 3.

Figure 3:
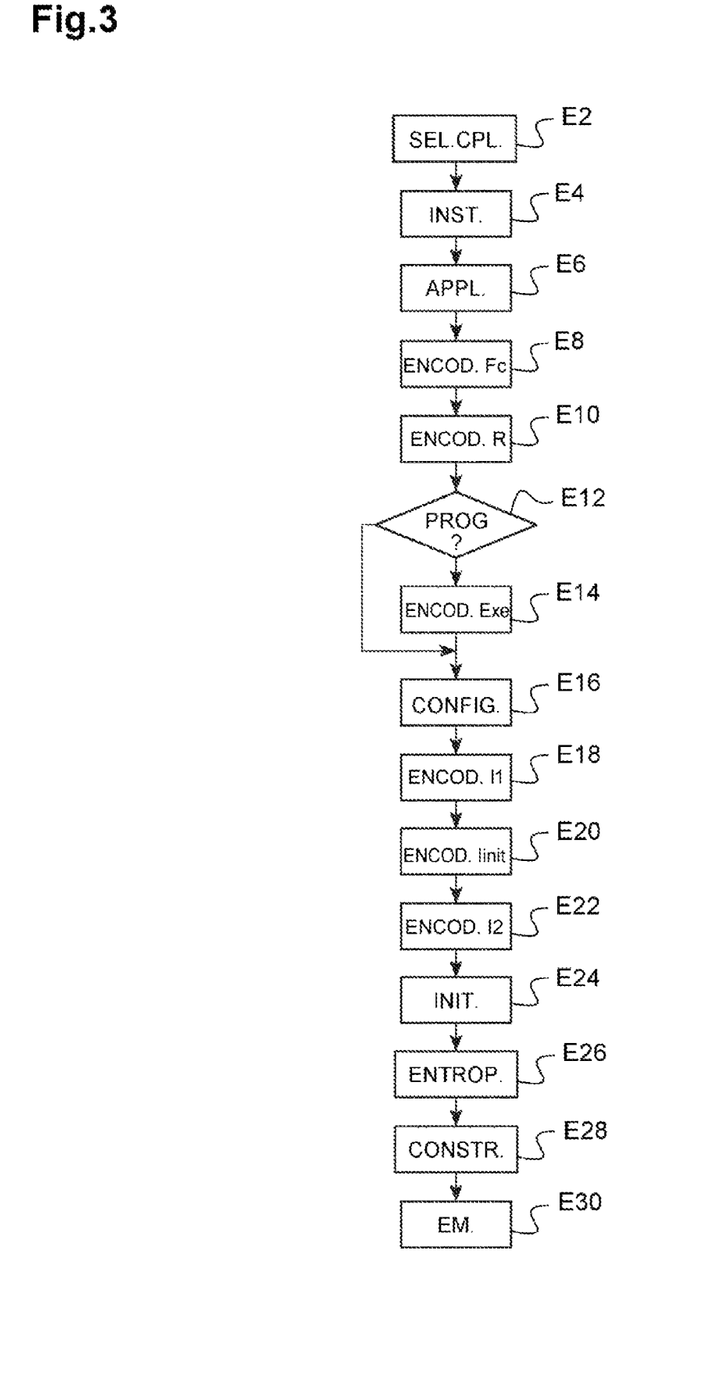
FIG. 3 is a flowchart showing steps of an encoding method implemented within the electronic encoding device of FIG. 1.

The method of FIG. 3 starts with a step E2 of selecting an encoding process—decoding process couple. As already indicated for the encoding process, the encoding process and the decoding process each use at least one artificial neural network.

In the example described here, the encoding process is implemented by an encoding artificial neural network and the decoding process is implemented by a decoding artificial neural network.

The unit formed by the encoding artificial neural network and the decoding artificial neural network (the encoding artificial neural network output being applied to the decoding artificial neural network input) forms for example an autoencoder.

The encoding process—decoding process couple is for example selected among a plurality of predefined encoding process—decoding process couples, that is to say here among a plurality of encoding artificial neural network—decoding artificial neural network couples.

The encoding process—decoding process couple may for example be selected among encoding process—decoding process couples for which the decoding process uses an artificial neural network available for an electronic decoding device (such as the electronic decoding device 20 shown in FIG. 5 and described hereinafter). For that purpose, the electronic encoding device can possibly receive beforehand (from the electronic decoding device or a dedicated server) a list of artificial neural networks accessible by this electronic decoding device.

The encoding process—decoding process couple may also be selected as a function of the intended application (indicated for example by a user through a user interface, not shown, of electronic encoding device 2). For example, if the intended application is videoconference, the selected encoding process—decoding process couple includes a low-latency decoding process. In other applications, the selected encoding process—decoding process couple will include a random-access decoding process.

In a low-latency video-sequence decoding process, an image of the video sequence is for example represented by encoded data that may immediately be sent and decoded; the data may then be sent in the display order of the video images, which ensures in this case a one-frame latency between encoding and decoding.

In a random-access video-sequence decoding process, the encoded data relating to a plurality of images, respectively, are sent in a different order than the display order of these images, which allows increasing the compression. Encoded images without reference to the other images (so-called intra frames) may then be encoded on a regular basis, which allows starting the video sequence decoding from several locations in the encoded stream.

Reference may be made for that purpose to the article "*Overview of the High Efficiency Video Coding (HEVC) Standard*", by G. J. Sullivan, J.-R. Ohm, W.-J. Han and T. Wiegand, in IEEE Transactions on Circuits and Systems for Video Technology, vol. 22., no. 12, pp. 1649-1668, December 2012.

The different criteria for selecting the encoding process—decoding process couple may possibly be combined together.

Once the encoding process—decoding process couple selected, control module 5 proceeds, at step E4, to the configuration of parallel processing unit 6 in such a way that parallel processing unit 6 can implement the encoding process selected.

This step E4 comprises in particular the instantiation, within parallel processing unit 6, of encoding artificial neural network 8 used by the selected encoding process.

This instantiation may comprise in particular the following steps:
  reserving, within parallel processing unit 6, the memory space required for implementing the encoding artificial neural network; and/or
  programming parallel processing unit 6 with the weights Γ and activation functions defining encoding artificial neural network 8; and/or
  loading part at least of content data B in a local memory of parallel processing unit 6.

The method of FIG. 3 then comprises a step E6 of implementing the encoding process, that is to say here applying content data B to the input of encoding artificial neural network 8 (or, in other words, a step of activating encoding artificial neural network 8 with content data B as an input).

Step E6 thus allows producing representative values V (here at the output of encoding artificial neural network 8).

The following steps relate to the encoding (i.e. preparation) of the data stream intended to the electronic decoding device (for example, electronic decoding device 20 described hereinafter with reference to FIG. 5).

The method thus comprises in particular a step E8 of encoding a first header part Fc that comprises data characteristic of the audio or video content representation format (here, for example data linked to the format of the video sequence that is being encoded).

These data forming the first header part Fc indicate for example the image sizes (in pixels), the frame rate, the bit depth of the luminance information and the bit depth of the chrominance information. These data are for example built on the basis of the above-mentioned format data P (after a potential reformating).

Control module 5 performs at step E10 the encoding of a second header part comprising data R indicative of the decoding artificial neural network (associated with the encoding process—decoding process couple selected at step E2).

According to a first possible embodiment, these indicative data R may comprise an identifier of the decoding artificial neural network.

Such an identifier indicates (among a plurality of decoding artificial neural network, for example among all the decoding artificial neural networks available for the electronic decoding device) the decoding artificial neural network that corresponds to the above-mentioned encoding artificial neural network 8, such decoding artificial neural network having therefore to be used for decoding representative values V.

In other words, such an identifier defines by convention (shared in particular by the electronic encoding device and the electronic decoding device) this decoding artificial neural network, for example among all the decoding artificial neural networks available for (or accessible by) the electronic decoding device. As already indicated, electronic encoding device 2 can possibly receive beforehand (from the electronic decoding device or a dedicated server) a list of artificial neural networks accessible by the electronic decoding device.

According to a second possible embodiment, these indicative data R may comprise descriptive data of the decoding artificial neural network.

The decoding artificial neural network (corresponding to the above-mentioned encoding artificial neural network 8) is for example encoded (i.e. represented) by these descriptive data (or data encoding the decoding artificial neural network) in accordance with a standard such as MPEG-7 part 17 or with a format such as JSON.

Reference may be made for that purpose to the article "*DeepCABAC: Context-adaptive binary arithmetic coding for deep neural network compression*", by S. Wiedemann et al., in Proceedings of the 36th International Conference on Machine Learning, Long Beach, California, PMLR 97, 2019, or to the article "*Compact and Computationally Efficient Representation of Deep Neural Networks*", by S. Wiedemann et al., in IEEE Transactions on Neural Networks and Learning Systems (Vol. 31, Iss. 3), March 2020.

It may also be provided that indicative data R comprise an indicator indicating if the decoding artificial neural network belongs to a predetermined set of artificial neural networks (in which case the first possible embodiment mentioned hereinabove is used) or if the decoding artificial neural network is encoded in the data stream, i.e. represented by means of the above-mentioned descriptive data (in which case the second possible embodiment mentioned hereinabove is used).

The method of FIG. 3 continues with a step E12 of determining the possibility for the electronic decoding device to implement the decoding process using the decoding artificial neural network.

Control module 5 determines for example this possibility by determining (potentially by means of previous exchanges between the electronic encoding device 2 and the electronic decoding device) if the electronic decoding device comprises a module suitable to implement this decoding process or a suitable software for implementation of this decoding process by the electronic decoding device when this software is executed by a processor of the electronic decoding device.

If control module 5 determines that it is possible for the electronic decoding device to implement the decoding process, the method continues with step E16 described hereinafter.

If control module 5 determines that it is not possible for the electronic decoding device to implement the decoding process, the method performs step E14 described hereinafter (before going to step E16).

As an alternative, the choice to perform or not step E14 (before performing step E16) could be made on another criterion, for example as a function of a dedicated indicator stored within electronic encoding device 2 (and possibly adjustable by the user via a user interface of electronic encoding device 2) or as a function of a choice made by the user (obtained for example via a user interface of electronic encoding device 2).

Control module 5 encodes in the data stream, at step E14, a third header part containing a computer program Exe (or code) executable by a processor of the electronic decoding device. (The use of the computer program Exe within the electronic decoding device is described hereinafter with reference to FIG. 5.)

In order to be adapted to an execution within the electronic decoding device, the computer program is for example chosen within a library as a function of information relating to the hardware configuration of the electronic decoding device (information received for example during previous exchanges between the electronic encoding device 2 and the electronic decoding device).

Then, at step E16, control module 5 performs configuration of the entropy encoding.

During this configuration step 16, control module 5 determines a set of statistical sources with which performing the entropy encoding. Control module 5 determines for example a number of statistical sources (and thus of contexts) to be used for entropy encoding.

For that purpose, the control module 5 may for example analyze the representative values V produced as indicated hereinabove and identify therein how many different statistical sources are included therein. According to another possibility, the control module 5 may chose the number of statistic sources as a function of the complexity that is desired to be allowed during the encoding and/or decoding.

Therefore, the control module 5 can subdivide the signal formed by the set of representative values V into a number (for example lower than or equal to a predetermined number, or as an alternative, without limitation of the number thereof) of sub-signals according to predefined criteria.

Hereinafter, the number of different statistical sources identified in the signal formed by representative values V (i.e. the number of contexts in which the entropy encoder will be parameterized during the entropy encoding of representative values V) is denoted K. For example, K=160.

In the example described here, control module 5 can create as many sub-signals as feature maps F, or as many sub-signals as locations (i.e. distinct positions) in a feature map F. It may possibly be further provided that control module 5 be able to merge the sub-signals that have the same statistical distributions (or very similar statistical distributions).

Therefore, control module 5 also determines, during the configuration step E16, with which statistical source (and hence which context) is associated each type of representative value V (i.e., here, each element of a feature map).

For example, if control module 5 creates as many sub-signals as feature maps F, the context associated with one element of a feature map F (i.e. to be used to parameterize the entropy encoding of this element) depends on the relevant feature map F.

On the other hand, if control module 5 creates as many sub-signals as locations in each feature map F, the context associated with one element of a feature map F (i.e. to be used to parameterize the entropy encoding of this element) depends on the location of this element in the feature map F.

The method of FIG. 3 then continues with steps of encoding data representative of the entropy encoder configuration determined at step E16.

Therefore, the method of FIG. 3 first comprises a step E18 of encoding a fourth header part comprising a piece of information I1 indicative of the set of contexts used for the entropy encoding. In the example described herein, the piece of information I1 is indicative of the number K of contexts used for the entropy encoding.

The method of FIG. 3 then comprises a step E20 of encoding a fifth header part comprising, for each context used for the entropy encoding, a piece of data Iinit for parameterizing the relevant context.

In the case described here, in which the entropy encoding used is of the CABAC type, the parameterization piece of data Iinit associated with a given context is a piece of data for initializing this context, as described for example in Recommendation ITU-T H.265, part "9.3.2.2 *Initialization process for context variables*".

In other embodiments, the parameterization piece of data associated with a given context may be a piece of data indicative of the probability model used for the relevant context during entropy encoding.

The method of FIG. 3 then comprises a step E22 of encoding a sixth header part comprising data I2 indicating, for each type of representative value V, the context in which the entropy encoding of the representative values V having this type is made.

In the described example, as already indicated, control module 5 selects as already indicated the assignment of the different contexts to the different feature maps F, respectively (each feature map F forming a sub-signal), or to the different positions (or locations) defined in the feature maps F, respectively (the elements having a given position forming a sub-signal).

It is hence proposed here that the data I2 comprise:
- an indicator I2_mode that indicates, if its value is 0, that a context is associated with each feature map F and, if its value is 1, that a context is used for each position in the feature maps F;
- a plurality of identifiers I2_map[i] respectively indicating the contexts used for the different types of representative values V.

If indicator I2_mode is equal to 0, the different types of representative values correspond to the different feature maps F. If indicator I2_mode is equal to 1, the different types of representative values correspond to the different positions within a feature map F.

Hereinafter is described (unless otherwise stated) the case in which the control module 5 selects the assignment of the different contexts to the different feature maps, i.e. in which indicator I2_mode is equal to 0.

The method of FIG. 3 continues with a step E24 of initializing entropy encoder 10 (by control module 5) by means of the above-mentioned parameterization data relating to the different contexts. This type of initialization is described in the above-mentioned document (Recommendation ITU-T H.265, part "9.3.2.2 Initialization process for context variables").

The method of FIG. 3 then comprises a step E26 of entropy encoding of the representative values V by entropy encoder 10, the entropy encoder 10 being, at all times, parameterized (by control module 5) in the context C that is used (based on the choices made as described hereinabove) for the type of representative value V being processed.

For example, in the example described herein, for entropy encoding the representative values V contained in a given feature map F, control module 5 parameterizes entropy encoder 10 in the context C that is associated with this given feature map F and applies successively (in a predefined order) the elements of this feature map F to the input of entropy encoder 10.

Entropy encoder 10 thus produces as an output a sequence Fnn of binary elements representing the audio or video content, in compressed form.

Step E26 may comprise in some cases a sub-step (prior to the entropy encoding as such) of binarizing the representative values V, as described in the above-mentioned article "Context-based adaptive binary arithmetic coding in the H.264/AVC video compression standard". The object of this binarization step is to convert a representative value V able to take a great number of values into a sequence of binary elements, each binary element being encoded by entropy encoding (and in this case, a context is associated with the encoding of each binary element).

In particular, when step E6 allows the processing of part only of the audio or video content to be compressed (for example, when step E6 performs the processing of a block, or a component, or an image of a video sequence to be compressed), it is possible to repeat the implementation of steps E6 (to obtain representative values of the successive parts of the content) and E26 (to perform the entropy encoding of these representative values).

Processor 4 can thus construct at step E28 the complete data stream comprising header Fet and sequence Fnn of binary elements.

The complete data stream is constructed in such a way that header Fet and sequence Fnn of binary elements are identifiable individually.

According to a possible embodiment, header Fet contains an indicator of binary element sequence Fnn beginning in the complete data stream. This indicator is for example the location, in bits, of the beginning of sequence Fnn of binary elements from the beginning of the complete data stream. (In other words, the header has in this case a predetermined fixed length.)

Other means for identifying header Fet and sequence Fnn of binary elements can be contemplated as an alternative, as for example a marker (i.e. a combination of bits used to indicate the beginning of sequence Fnn of binary elements and the use of which is forbidden in the rest of the data stream, or at least in header Fet).

The data stream constructed at step E28 may be encapsulated in transmission formats known per se, such as "Packet-Transport System" or "Byte-Stream" formats.

In the case of "Packet-Transport System" format (as proposed for example by the RTP protocol), the data are encoded by identifiable packets and transmitted on a communication network. The network can easily identify the boundaries of the data (images, groups of images and here header Fet and sequence Fnn of binary elements), using packet identification information provided by the network layer.

In "Byte-Stream" format, there is no specifically packets and the construction of step E28 must allow identifying the boundaries of the relevant data (such as boundaries between parts of the stream corresponding to each image, and here between header Fet and sequence Fnn of binary elements) using additional means, such as the use of network abstraction layer (NAL) units, where unique binary combinations (such as 0x00000001) make it possible to identify the boundaries between data).

The complete data stream constructed at step E28 can then be emitted at step E30 towards electronic decoding device 20 described hereinafter (by communication means not shown and/or through at least one communication network), or stored within the electronic encoding device 2 (for later transmission or, as an alternative, later decoding, for example within the electronic encoding device itself, which is in this case designed to further implement the decoding method 20 described hereinafter with reference to FIG. 5).

Figure 4:
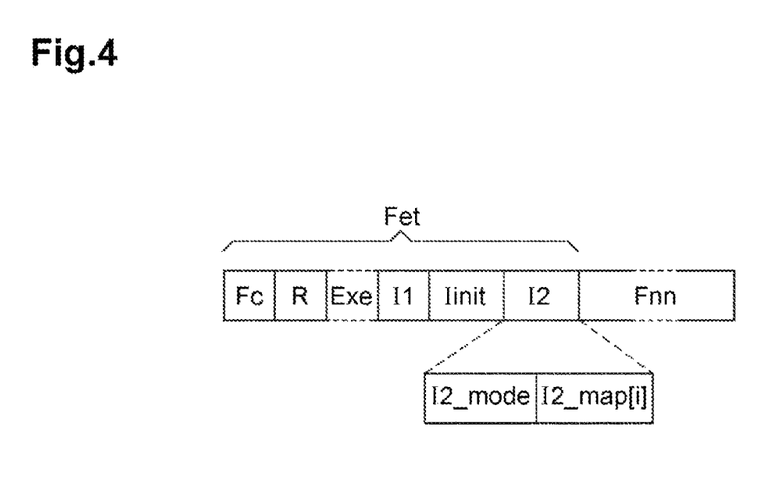
FIG. 4 shows the data stream produced by the electronic encoding device of FIG. 1.

This data stream thus comprises, as shown in FIG. 4, header Fet and sequence Fnn of binary elements.

As is evident from the above, header Fet comprises:
- a first part Fc that comprises data characteristics of the audio or video content representation format;
- a second part that comprises data R indicative of the decoding artificial neural network (or generally data indicative of a machine learning method used for the decoding);
- possibly a third part that comprises a computer program Exe executable by a processor of the electronic decoding device;
- a fourth part that comprises a piece of information I1 indicative of the set of contexts used for the entropy encoding;
- a fifth part that comprises, for each context used for entropy encoding, a piece of data Iinit for parameterizing the relevant context;
- a sixth part I2 that comprises a plurality of identifiers I2_map[i] each representing a context in which the entropy encoder has been parameterized for entropy encoding of the data of a certain type and thus in which an entropy decoder is parameterized to obtain the data of this type when the entropy decoder receives as an input part of the sequence of binary elements, as described hereinafter.

According to a conceivable alternative, it could be provided not to transmit the piece of information I1 indicative of the set of contexts used for the entropy encoding, wherein the entropy encoder and the entropy decoder can then use a number of contexts defined in advance (by convention).

Figure 5:
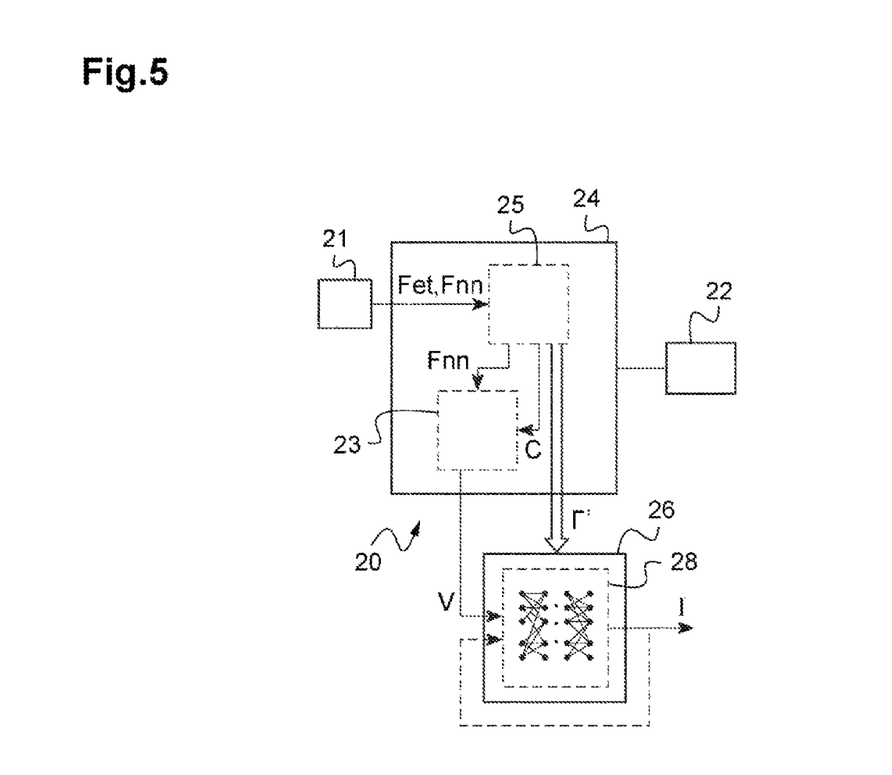
FIG. 5 shows an example of electronic decoding device according to the invention.

FIG. 5 shows an electronic decoding device 20 using an entropy decoder 23.

This electronic decoding device 20 comprises a receiving unit 21, a processor 24 (for example, a microprocessor) and a parallel processing unit 26, for example a Graphical Processing Unit or GPU, or a Tensor Processing Unit or TPU.

Reception unit 21 is for example a communication circuit (such as a radiofrequency communication circuit) and makes it possible to receive data (and in particular here the data stream described hereinabove) from an external electronic device, such as electronic encoding device 2, and to communicate these data to processor 24 (to which reception unit 21 is for example connected by a bus).

Electronic decoding device 20 also comprises a storage unit 22, for example a memory (possibly a rewritable non-volatile memory) or a hard-drive. Although storage unit 22 is shown in FIG. 5 as an element distinct from processor 24, storage unit 22 could as an alternative be integrated to (i.e. included in) processor 24.

Processor 24 is in this case adapted to execute successively a plurality of instructions of a computer program stored for example in storage unit 22.

Part of these instructions makes it possible, when executed by processor 24, to implement a control module 25 having in particular the functionalities described hereinafter. As an alternative, some of the functionalities of control module 25 could be implemented due to the execution, by processor 24, of instructions identified within header Fet at step E52 as described hereinafter.

Another part of the instructions stored in storage unit 22 makes it possible, when executed by processor 24, to implement the already-mentioned entropy decoder 23. As an alternative, entropy decoder 23 could be implemented due to the execution, by processor 24, of instructions identified within header Fet at step E52 as described hereinafter.

Entropy decoder 23 is designed to perform an entropy decoding that is the reverse of the entropy encoding performed by entropy encoder 10 of electronic encoding device 2 described hereinabove with reference to FIG. 1. Entropy decoder 23 is thus here an entropy decoder of the CABAC ("Context-based adaptive binary arithmetic coding") type. As an alternative, it could be another type of entropy encoder, for example a decoder of the Huffman type, an arithmetic decoder or an LZW ("Lempel-Ziv-Welch") decoder.

Parallel processing unit 26 is designed to implement artificial neural network 28 after having been configured by processor 24 (here, precisely, by control module 25). For that purpose, parallel processing unit 26 is designed to perform in parallel, at a given time, a plurality of operations of the same type.

Generally, the parallel processing unit 26 is designed in such a way as to implement a machine learning method (such as, for example, a deep learning method or a random forest learning method) after having been configured by processor 24, for example by means of data for configuring such a machine learning method received within the data stream.

As schematically shown in FIG. 5, processor 24 receives (here via reception unit 21) the data stream comprising header Fet and sequence Fnn of binary elements.

As explained hereinafter, the artificial neural network 28 is used within the framework of a processing of data obtained by entropy decoding of sequence Fnn of binary elements, this data processing aiming to obtain an audio or video content corresponding to the initial audio or video content B.

Storage unit 22 can store a plurality of parameter sets, each parameter set defining a decoding artificial neural network. As explained hereinafter, processor 24 can in this case configure parallel processing unit 26 by means of a particular set of parameters among these parameter sets in such a way that parallel processing unit 26 can then implement the artificial neural network defined by this particular set of parameters.

Storage unit 22 may in particular store a first set of parameters defining a first artificial neural network forming a random access decoder and/or a second set of parameters defining a second artificial neural network forming a low latency decoder.

In this case, electronic decoding device 20 has decoding options in advance for both situations where random access to the content is desired and situations where the content is to be displayed without delay.

Now will be described with reference to FIG. 6 a decoding method that is implemented within electronic decoding device 20 and using, on the one hand, entropy decoder 23 and, on the other hand, artificial neural network 28 implemented by parallel processing unit 26.

Figure 6:
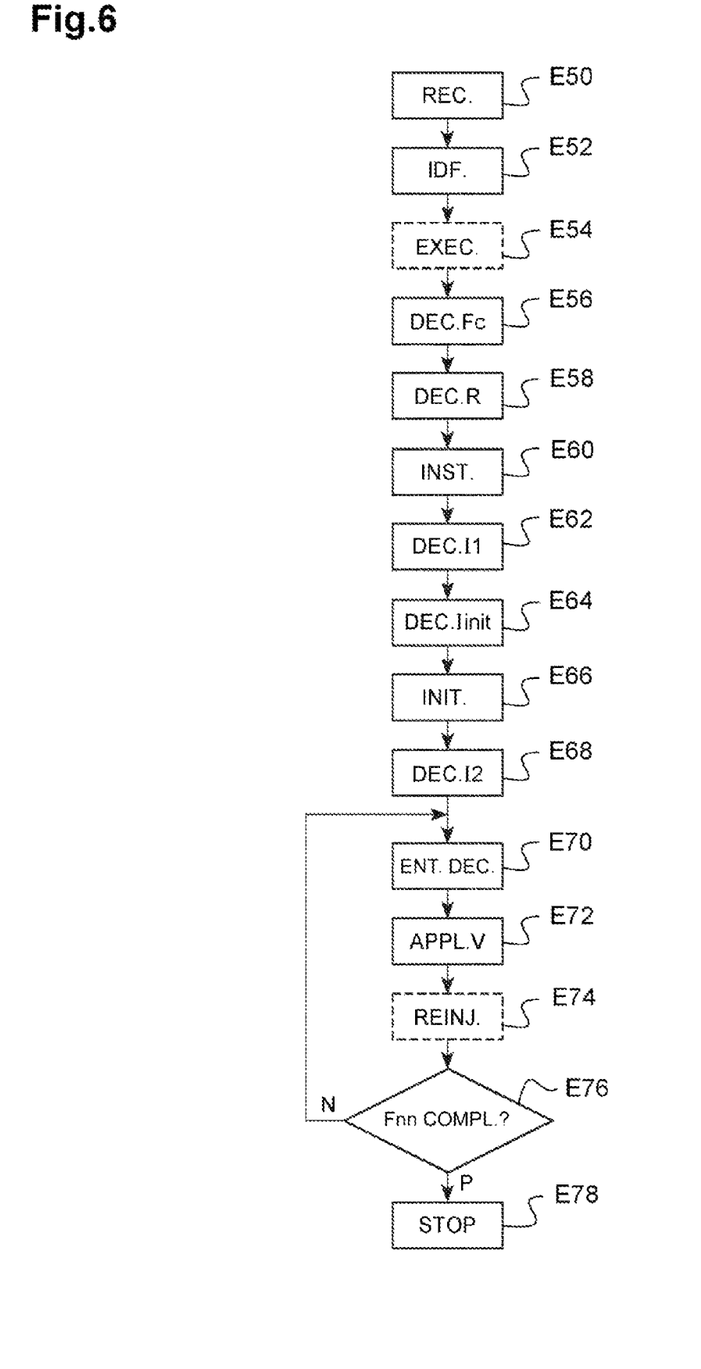
FIG. 6 is a flowchart showing steps of a decoding method implemented within the electronic decoding device of FIG. 5.

The method of FIG. 6 starts with a step E50 of receiving (by electronic decoding device 20, and precisely here by reception unit 21) the data stream comprising header Fet and sequence Fnn of binary elements. Reception unit 21 transmits the received data stream to processor 24 for processing by control module 25.

Control module 25 then proceeds to a step E52 of identifying header Fet and sequence Fnn of binary elements within the received data stream, for example by means of the indicator of binary element sequence beginning (already mentioned in the description of step E28).

Control module 25 can also identify at step E52 the different parts of header Fet (as described hereinabove with reference to FIG. 4).

In the cases where executable instructions (such as the instructions of the computer program Exe) are identified (i.e. detected) within the first data at step E52, control module 25 may launch, at step E54, the execution of these executable instructions in order to implement certain at least of the steps (described hereinafter) of processing of the header data (and possibly of entropy decoding). These instructions may be executed by processor 24 or, as an alternative, by a virtual machine instantiated within electronic decoding device 20.

The method of FIG. 6 continues with a step E56 of decoding data Fc that are characteristic of the audio or video content representation format in such a way as to obtain characteristics of this format. In the case of a video content, for example, the decoding of data part Fc makes it possible to obtain the image sizes (in pixels) and/or the frame rate and/or the binary depth of the luminance information and/or the binary depth of the chrominance information.

Control module 25 then proceeds to a step E58 of decoding data R indicative of the decoding artificial neural network to be used.

According to a first possibility, as already indicated, these data R are an identifier indicating decoding artificial neural network 28, for example within a predetermined set of artificial neural networks.

This predetermined set is for example the set of decoding artificial neural networks accessible by electronic decoding device 20, i.e. the set of artificial neural networks for which electronic decoding device 20 stores a set of parameters defining the relevant artificial neural network (as indicated hereinabove) or may have access to this set of parameters by connection to remote electronic equipment such as a server (as explained hereinafter).

Control module 25 may in this case proceed to the reading, for example in the storage unit 22, of a set of parameters associated with the decoded identifier (this set of parameters defining the artificial neural network identified by the decoded identifier).

As an alternative (or in the case where no set of parameters is stored in storage unit 22 for the artificial neural network identified by the decoded identifier), control module 25 may transmit a request for a set of parameters to a remote server (this request including for example the decoded identifier) and receive as a response the set of parameters defining the artificial neural network identified by the decoded identifier.

According to a second possible embodiment, data R are data Rc describing decoding artificial neural network 28.

As already indicated, these descriptive data (or encoding data) are for example encoded in accordance with a standard such as MPEG-7 part 17 or with a format such as JSON.

The decoding of these descriptive data makes it possible to obtain the parameters defining the artificial neural network to be used for decoding data obtained (by entropy decoding) from the sequence Fnn of binary elements.

In some embodiments, the use of the above-mentioned first possibility or second possibility depends on an indicator also included in data R, as already indicated.

Whichever option is used, decoding data R indicative of the decoding artificial neural network to be used makes it possible (here for control module 25) to determine the features of decoding artificial neural network 28. For example, in the example described herein, control module 25 thus determines the number N of feature maps expected at the input of decoding artificial neural network 28 and the sizes H, W of these feature maps. Indeed, the input layer of decoding artificial neural network 28 corresponding to the output layer of encoding artificial neural network 8 as explained hereinabove (see for example the description of step E2), each element of a feature map F is associated in a predetermined manner with an input node (or node of the input layer) of the decoding artificial neural network. The number and sizes of the feature maps F are thus linked to the features of decoding artificial neural network 28, as well as certain header data such as the above-mentioned data Fc (comprising in particular the image sizes).

Control module 25 then proceeds, at step E60, to the configuration of parallel processing unit 26 by means of the parameters defining decoding artificial neural network 28 (parameters obtained at step E58), or generally the machine learning method used, in such a way that parallel processing unit 26 can implement decoding artificial neural network 28 (or generally the machine learning method, for example, as an alternative, another deep learning method or a random forest learning method).

This configuration step E60 comprises in particular the instantiation of decoding artificial neural network 28 within parallel processing unit 26, here using the parameters obtained at step E58.

This instantiation may comprise in particular the following steps:
- reserving, within parallel processing unit 26, the memory space required for implementing decoding artificial neural network 28; and/or
- programming parallel processing unit 26 with the parameters (including for example weights P and activation functions) defining decoding artificial neural network 28 (parameters obtained at step E58).

Control module 25 then proceeds, at step E62, to the decoding of information I1 indicative of the set of contexts usable within entropy decoder 23 (here indicative of the number K of contexts usable within entropy decoder 23). As already indicated, for example, K=160.

Control module 25 then proceeds, at step E64, to the decoding of parameterization data Iinit relating to the different contexts, respectively, of the set of contexts used (this set being determined thanks to information I1 decoded at step E62).

Control module 25 may then implement a step E66 of initializing each context usable within the entropy decoder 23 using the relevant context parameterization piece of data Iinit (decoded at step E64).

More precisely, entropy encoder 23 being here adaptive, each context is initialized with the probability model defined by the parameterization data Iinit related to this context.

As an alternative, if entropy decoder 23 uses a fixed probability model for each context, control module 25 configures, at step E66, each context usable by the entropy decoder with the probability model defined by the parameterization data Iinit related to this context.

Control module 25 then performs a step E68 of decoding data I2 indicating, for each type of data to be obtained by entropy decoding, the context in which the entropy encoding of the data having this type has been made and therefore in which entropy encoder 23 has to be parameterized for the entropy decoding of this piece of data.

In the example described herein, control module 25 first decodes (i.e. here consults) indicator I2_mode that indicates, if its value is 0, that a context is associated with each feature map F and, if its value is 1, that a context is used for each position in the feature maps F.

Thus, as a function of the value of indicator I2_mode, of number K and of sizes H, W of the feature maps, control module 25 decodes (i.e. here reads in the data stream) identifiers I2_map[i] each representative of a context in which entropy decoder 23 has to be parameterized to obtain the data of this type when entropy decoder 23 receives as an input part of sequence Fnn of binary elements.

For example, if indicator I2_mode is equal to 0, control module 25 decodes (or reads), for each of the N feature maps F, identifier I2_map[i] representative of the context in which entropy decoder 23 has to be parameterized to obtain the data (here, representative values V) relating to this feature map F. In other words, in this case, the type of a piece of data is defined by the feature map F to which this piece of data belongs (this piece of data being here a representative value V).

If indicator I2_mode is equal to 1, control module 25 decodes (or reads), for each of the W×H positions (or locations) in each feature map F, identifier I2_map[i] representative of the context in which entropy decoder 23 has to be parameterized to obtain the data (here, representative values V) located at this position. In other words, in this case, the type of a piece of data is defined by the position of this piece of data (here a representative value V) in the relevant feature map F.

For each piece of data of the sequence of expected data (i.e. here for each of the representative values V to be applied to the input of the decoding artificial neural network 28), at step E70, control module 25:
- determines the context to be used for decoding this piece of data on the basis of the identifier I2_map[i] associated with the type of this piece of data;
- parameterizes entropy decoder 23 in the so-determined context C; and
- applies to the input of entropy decoder 23 a part of sequence Fnn of binary elements (in the order of reception of these binary elements), in such a way that entropy decoder 23 produces as an output the expected piece of data (here a representative value V) identical to that which has been encoded by entropy encoding at step E26.

As already indicated (see hereinabove the description of step E58), control module 25 has previously determined the number N and the sizes H, W of the feature maps, and thus knows the number of representative values V (or expected data) to be obtained during entropy decoding step E70. Moreover, as mentioned in the description of step E26, the different representative values V are encoded by entropy encoding in a predefined order and the representative values V (expected data) are hence decoded in this same predefined order.

According to what has already been explained, if indicator I2_mode is equal to 0, the context C determined to decode an element (i.e. a representative value V) of a given feature map F is thus determined on the basis of the identifier I2_map[i] associated with this given feature map F (the type of data corresponding in this case to the feature map including this piece of data).

Likewise, if indicator I2_mode is equal to 1, the context C determined to decode a given element (i.e. a representative value V) of a feature map F is determined on the basis of the identifier I2_map[i] associated with the position of this given element in the feature map (the type of data corresponding in this case to the position of the piece of data).

Entropy decoder 23 thus produces at step E70 the expected sequence of data, i.e. here the set of respective values V.

Processor 24 (here, directly at the output of entropy encoder 23, or as an alternative, through control module 25) can then apply (i.e. present), at step E72, representative values V to artificial neural network 28 implemented by parallel processing unit 26 in such a way that these data are processed by a decoding process using at least partly artificial neural network 28.

In the example described here, artificial neural network 28 receives as an input representative values V and produces as an output a representation I of the encoded content, adapted for a reproduction on an audio or video reproduction device. In other words, representative values V (here in the form of feature maps F) are applied to the input layer of artificial neural network 28 and the output layer of artificial neural network 28 produces the above-mentioned representation I of the encoded content. In the case of a video content (comprising an image or a sequence of images), artificial neural network 28 thus produces as an output (i.e. on its output layer) at least one matrix representation I of an image.

As already seen for the encoding at the above-mentioned step E6, the association of an element (i.e. a representative value V) of a feature map F with an input node (or node of the input layer) is predefined.

In certain embodiments, for processing certain representative values V (corresponding for example to a block or an image), artificial neural network 28 may receive as an input certain at least of the data produced at the output of artificial neural network 28 during the processing of previous data (here prior representative values V), corresponding for example to the preceding block or to the preceding image. In this case, it is proceeded to a step E74 of reinjecting data produced at the output of artificial neural network 28 to the input of artificial neural network 28.

Moreover, according to other possible embodiments, the decoding process could use a plurality of artificial neural networks, as already mentioned hereinabove about the processing of content data B.

Control module 25 then determines at step E76 if the processing of sequence Fnn of binary elements by means of artificial neural network 28 is completed.

In case of negative determination (N), the method loops at step E70 to perform an entropy decoding of the following part of sequence Fnn of binary elements and to apply other representative values V (produced by this entropy decoding) to artificial neural network 28.

In case of positive determination (P) the method is ended at step E78.

The invention claimed is:

1. A decoding method implemented by a decoding device and comprising:
decoding a data stream including a plurality of identifiers and a sequence of binary elements, into a sequence of data of respective predetermined types, the method comprising, obtaining each piece of data of said sequence by:
determining a context based on an identifier, from among the plurality of identifiers, that is associated with the respective type of the respective piece of data; and
decoding one part of the sequence of binary elements by means of an entropy decoder receiving the sequence of binary elements as an input and parameterized in the determined context.

2. The decoding method according to claim 1, wherein the data stream comprises a piece of information indicative of a set of contexts usable within the entropy decoder.

3. The decoding method according to claim 2, wherein said piece of information is indicative of a number of contexts usable within the entropy decoder.

4. The decoding method according to claim 3, further comprising applying the obtained data to an input of an artificial neural network.

5. The decoding method according to claim 3, wherein the sequence of data forms a set of feature maps.

6. The decoding method according to claim 2, wherein the data stream comprises, for each of the contexts usable within the entropy decoder, a parameterization piece of data to parameterize the respective context.

7. The decoding method according to claim 6, further comprising a step of initializing each of the contexts usable within the entropy decoder using the parameterization piece of data for parameterizing the respective context.

8. The decoding method according to claim 7, further comprising applying the obtained data to an input of an artificial neural network.

9. The decoding method according to claim 6, further comprising applying the obtained data to an input of an artificial neural network.

10. The decoding method according to claim 2, further comprising applying the obtained data to an input of an artificial neural network.

11. The decoding method according to claim 2, wherein the sequence of data forms a set of feature maps.

12. A non-transitory computer-readable medium on which is stored a computer program comprising instructions executable by a processor and configured to implement the decoding method according to claim 1 when the instructions are executed by the processor.

13. The decoding method according to claim 1, further comprising applying the obtained data to an input of an artificial neural network.

14. The decoding method according to claim 13, wherein the artificial neural network is implemented by a processor, the method further comprising configuring the processor as a function of data included in the data stream.

15. The decoding method according to claim 1, wherein the sequence of data forms a set of feature maps.

16. The decoding method according to claim 15, wherein the identifiers are respectively associated with the feature maps of the set of feature maps, the context determined to obtain an element of a specific one of the feature maps being determined based on the respective identifier associated with the specific one feature map.

17. The decoding method according to claim 15, wherein the feature maps of the set of feature maps have a common structure within which each element of a respective feature map of the feature maps is defined by a position, and wherein the identifiers are respectively associated with the different positions in the common structure, the context determined to obtain a specific element of the respective feature map being determined based on the identifier associated with the position defining the specific element.

18. An electronic device to decode a data stream including a plurality of identifiers and a sequence of binary elements, into a sequence of data of respective predetermined types, the electronic device comprising:
   an entropy decoder receiving the sequence of binary elements as an input; and
   at least one processor configured to determine a context based on an identifier, from the plurality of identifiers, that is associated with the respective type of the respective piece of data to be obtained, and to parameterize the entropy decoder in the determined context to obtain said piece of data at an output of the entropy decoder.

\* \* \* \* \*